United States Patent
Fujii et al.

(10) Patent No.: US 9,385,012 B2
(45) Date of Patent: Jul. 5, 2016

(54) SUBSTRATE PROCESSING METHOD AND SUBSTRATE PROCESSING APPARATUS

(71) Applicant: DAINIPPON SCREEN MFG. CO., LTD., Kyoto (JP)

(72) Inventors: Tatsuya Fujii, Kyoto (JP); Toru Endo, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/146,174

(22) Filed: Jan. 2, 2014

(65) Prior Publication Data

US 2014/0197129 A1 Jul. 17, 2014

(30) Foreign Application Priority Data

Jan. 15, 2013 (JP) .................................. 2013-004732
Nov. 13, 2013 (JP) .................................. 2013-234958

(51) Int. Cl.
| | |
|---|---|
| *H01L 21/306* | (2006.01) |
| *H01L 21/67* | (2006.01) |
| *H01L 21/311* | (2006.01) |
| *B08B 3/02* | (2006.01) |
| *H01L 21/3213* | (2006.01) |
| *H01L 21/465* | (2006.01) |
| *B44C 1/22* | (2006.01) |

(52) U.S. Cl.
CPC .............. *H01L 21/6708* (2013.01); *B08B 3/02* (2013.01); *B08B 3/024* (2013.01); *B44C 1/22* (2013.01); *B44C 1/227* (2013.01); *H01L 21/30604* (2013.01); *H01L 21/30608* (2013.01); *H01L 21/31111* (2013.01); *H01L 21/32134* (2013.01); *H01L 21/465* (2013.01); *H01L 21/6715* (2013.01); *H01L 21/67051* (2013.01); *H01L 21/67075* (2013.01)

(58) Field of Classification Search
CPC ................... H01L 21/67051; H01L 21/31111; H01L 21/6708; B08B 3/02; B08B 3/024
See application file for complete search history.

(56) References Cited

U.S. PATENT DOCUMENTS

| | | | | |
|---|---|---|---|---|
| 6,096,233 | A * | 8/2000 | Taniyama et al. ................ | 216/92 |
| 2009/0073394 | A1 | 3/2009 | Miyagi et al. .................... | 355/27 |
| 2011/0180113 | A1* | 7/2011 | Chien et al. ...................... | 134/32 |
| 2012/0318304 | A1 | 12/2012 | Wang et al. ...................... | 134/33 |

FOREIGN PATENT DOCUMENTS

| | | |
|---|---|---|
| CN | 101388333 A | 3/2009 |
| JP | 11-307492 | 11/1999 |
| JP | 2002-336761 | 11/2002 |

* cited by examiner

*Primary Examiner* — Jiong-Ping Lu
(74) *Attorney, Agent, or Firm* — Ostrolenk Faber LLP

(57) ABSTRACT

Scan step (S3) for moving a nozzle with etching liquid discharged therefrom is carried out such that etching liquid application position toward the rotating substrate moves from the edge portion toward the center portion of the principal face of the substrate. Thereafter, center discharging step (S4) for continuing the supply of the etching liquid toward the principal face of the substrate under the condition that the application position is positioned at the center portion of the principal face of the substrate W is conducted. Moving velocity of the liquid application position in the scan step (S3) is determined in accordance with supply condition of the etching liquid toward the substrate under the condition that the liquid application position is positioned at the center portion of the principal face of the substrate.

5 Claims, 8 Drawing Sheets

FIG. 11

| T (etching processing time) | T2 (center discharging time) | V1 (scan velocity) | σ (uniformity) |
|---|---|---|---|
| T01 | T21 | V11 | σ1 |
| T02 | T22 | V12 | σ2 |
| T03 | T23 | V13 | σ3 |
| T04 | T24 | V14 | σ4 |

T (etching processing time) = T1 (scan time) + T2 (center discharging time)

FIG. 12

| T (etching processing time) | T2 (center discharging time) | V1 (first scan velocity) | V2 (second scan velocity) |
|---|---|---|---|
| T01 | T21 | V11 | V21 |
| T02 | T22 | V12 | V22 |
| T03 | T23 | V13 | V23 |
| T04 | T24 | V14 | V24 |

T (etching processing time) = T1 (scan time) + T2 (center discharging time)

SUBSTRATE PROCESSING METHOD AND SUBSTRATE PROCESSING APPARATUS

BACKGROUND OF THE INVENTION

1. Field of the Invention

The Present invention generally relates to a substrate processing method or apparatus for supplying etching liquid toward a top or reverse face of a rotating substrate to carry out etching processing. Examples of substrates to be processed include semiconductor wafers, glass substrates for liquid crystal displays, glass substrates for plasma displays, substrates for FEDs (field emission displays), substrates for optical discs, substrates for magnet discs, substrates for magnet-optical discs, glass substrates for photomasks, substrates for ceramics, substrates for solar cells, or the like.

2. Description of Related Art

The substrate processing apparatus described in Japanese Unexamined Patent Application Publication No. 2002-336761 comprises a spin chuck for horizontally holding and rotating a wafer and a liquid supply nozzle for supplying a processing liquid toward the wafer held by the spin chuck.

The liquid supply nozzle is held by a holding member. The holding unit is supported by a rotational pivot connected to a rotation axis of positive/negative rotational motor. Also, liquid supply nozzle connects to a liquid supply pipe, which liquid supply pipe connects to an etching liquid supply pipe connected to an etching liquid supply member. Etching liquid is supplied to the liquid supply nozzle. Etching liquid spouted from the liquid supply nozzle is supplied toward the substrate in a state where the substrate is rotated by the spin chuck.

Specifically, the positive/negative rotational motor rotationally moves the liquid supply nozzle over the substrate, in a state that the liquid supply nozzle discharged an etching liquid, so that the etching liquid application position on the top face of the substrate shifts toward the center portion of the substrate (scan step). Thereafter, when the etching liquid application position reaches the center portion of the substrate, the positive/negative rotational motor stops the rotational movement of the liquid supply nozzle. After the rotational movement of the liquid supply nozzle is stopped, spouting of the etching liquid from the supply liquid nozzle toward the center portion of the substrate is continued for a predetermined time (CENTER SPOUT STEP). After the etching liquid from the liquid supply nozzle is stopped, The positive/negative rotational motor moves the liquid supply nozzle out of the area above the substrate by reversibly rotating a rotational shaft thereof.

In a substrate processing apparatus described in Japanese Patent Application Publication No. 2002-336761, etching processing is carried out taking into consideration of the difference of etching amounts between the edge portion and center portion in the center discharge step and differences of etching amounts between the edge, portion and center portion in the scan step.

More specifically, the temperature of the etching liquid supplied toward the principal face of the substrate in the center discharge step decreases toward the edge portion of the principal face of the substrate affected by vaporization heat. Accordingly, the center portion of the principal face of the substrate is etched deeper than the edge portion thereof, thereby increasing the amount of etching in a concentric manner from the edge portion toward the center portion. On the contrary, in the scan step, the edge portion of the principal face of the substrate is etched deeper than the center portion thereof because the former is exposed to the etching liquid longer than the latter, thereby increasing the amount of etching in a concentric manner from the center portion toward the edge portion.

The substrate processing apparatus described in Japanese Unexamined Patent Application Publication No. 2002-336761 carries out the scan step and center discharge step in order to offset the difference of etching amount between the edge portion and center portion of the principal face of a substrate, thereby it is possible to increase uniformity than in a case that only a center discharge step is carried out.

However, it must be noted that changes of supply condition of an etching liquid (center discharge condition) result in changes of etching conditions (distribution of etching amount). Thus changes of a center discharging condition may result in a decrease of etching uniformity at the final stage, unless changes are made as to supply conditions of etching liquid in the scan step such as scan rate and the like in concert with the changes of the center discharging condition. Due to lack of measures taken for such matters, the substrate processing apparatus described in Japanese Unexamined Patent Application Publication No. 2002-336761 may yield a low uniformity for certain etching conditions.

Also, with sophistication of devices formed on substrates, there is a growing demand for higher level of uniformity in etching. While amounts of etching are varied, uniform etching is required for each amount of etching.

Japanese Unexamined Patent Application Publication No. H11-307492 discloses a method of varying scan velocity according to a given equation (V1=V0/R). Likewise, U.S. Patent Application Publication No. 2012/318304 A1 discloses a method of varying scan velocity according to a given equation $V(r) XR^a$=constant.

It is conventionally known that etching amount in an edge portion of a substrate is lower than that in a center portion of the substrate, degrading uniformity of etching. By adapting the methods described in the Japanese Unexamined Patent Application Publication No. H11-307492 or U.S. Patent Application Publication No. 2012/318304 A1, it may be possible to achieve lesser degradation of etching uniformity due to lower etching amounts in an edge portion of a substrate.

However, it is not possible to offset the difference between etching amount in a center portion of a substrate and etching amount in an edge portion of the substrate according to a single equation in an across-the-board manner. Also, etching behaviors in edge portion of a substrate differ for every etching condition. Therefore, in practice, it is needed to find, through experiments, conditions with which degradation of etching amount in an edge portion of a substrate can be suppressed.

Unlike the present invention, neither the method described in the Japanese Unexamined Patent Application Publication No. H11-307492 nor the method described in the U.S. Patent Application Publication No. 2012/318304 A1 does not address to such problems.

Further, with these methods, scan velocity is changed in a continuous manner. More complicated control is needed for changing of scan velocity in a continuous manner than that in a stepwise manner. Thus it is preferable to change scan velocity in a constant or stepwise manner.

SUMMARY OF THE INVENTION

Thus it is an object of the present invention to carry out etching processing for a principal face of a substrate with high uniformity while adapting to changes of center discharging conditions by adjusting scan conditions.

A preferred embodiment of the present invention provides a substrate processing method for processing a substrate comprising: a scan velocity determining step of determining a moving velocity for moving a liquid application position on which the etching liquid is applied from an edge portion of a principal face of the substrate to a center portion of the principal face of the substrate according to a supply condition of the etching liquid under a state that the liquid application position is positioned at the center portion of the principal face of the substrate; a scan step of rotating the substrate about an rotational axis passing through the principal face of the substrate and moving a nozzle while discharging the etching liquid such that the liquid application position is moved from the edge portion of the principal face of the substrate to the center portion of the principal face of the substrate; and a center discharging step of rotating the substrate about the rotational axis while continuing the discharge of the etching liquid toward the principal face of the substrate, under the state that the liquid application position is positioned at the center portion of the principal face of the substrate. The supply condition of the etching liquid is at least one of: etching liquid density, etching liquid temperature, supply time for etching liquid, and etching liquid type.

According to this method, an etching liquid discharged from a nozzle out of is supplied toward a substrate rotating about a rotational axis. Specifically, the nozzle is driven to move such that an etching liquid application position for a principal face of the substrate is moved from an edge portion of the principal face of the substrate to the center portion of the principal face of the substrate at a given moving velocity (scan step). Thereafter, the discharge of the etching liquid is continued under a state that the liquid application position is positioned at the center portion of the principal face of the substrate (center discharging step). The moving velocity of the liquid application position in the scan step is determined in advance (scan velocity determining step), according to a supply condition of the etching liquid toward the substrate under the state that the liquid application position is positioned at the center portion of the principal face of the substrate, that is, a supply condition of the etching liquid in the center discharging step (center discharging condition). Therefore it is possible to enhance uniformity within substrate surfaces for all etching conditions because even when changes are made for a center discharging condition, a scan step corresponding thereto is carried out.

In the preferred embodiment of the present invention, the scan velocity determining step may be a step of determining the moving velocity according to a supply time for supplying the etching liquid toward the substrate under the state that the liquid application position is positioned at the center portion of the principal face of the substrate.

According to this method, a scan velocity according to a supply time for supplying the etching liquid is determined. Therefore, it is possible to change a distribution of etching amounts resulting from the scan step, according to a distribution of etching amounts resulting from the center discharging step. Thereby it is possible to assuredly enhance uniformity of etching amounts within substrate face. Moreover, because supply time of etching liquid is a linearly varying parameter, it is easy to calculate moving velocity of a liquid application position.

In the preferred embodiment of the present invention, the scan velocity determining step may be a step of determining the moving velocity of the liquid application position according to a table indicating relationship between the supply time of the etching liquid under the state that the liquid application position is positioned at the center portion of the principal face of the substrate and the moving velocity of the liquid application position.

According to this method, scan velocity is determined according to a table indicating relationship between the supply time of the etching liquid and the moving velocity of the liquid application position (scan velocity). That is, it is possible to determine an adequate scan velocity according to a supply time of the etching liquid, because the relationship between the supply time of the etching liquid and the scan velocity is figured out in advance.

In the preferred embodiment of the present invention, the scan velocity determining step may be a step of determining the moving velocity of the liquid application position according to a table indicating relationship between the supply time of the etching liquid under the state that the liquid application position is positioned at the center portion of the principal face of the substrate and a moving time of the liquid application position.

According to this method, scan velocity is determined according to a table indicating relationship between the supply time of the etching liquid and a moving time. That is, it is possible to determine an adequate scan velocity according to a supply time of the etching liquid, because the relationship between the supply time of the etching liquid and the time for scan is figured out in advance.

In the preferred embodiment of the present invention, the table may contain an etching uniformity where the scan step and the center discharging step are carried out at the move velocity determined according to the table. The scan velocity determining step may include a step of determining, prior to the scan step and the center discharging step, whether the etching uniformity is within an acceptable range.

In the preferred embodiment of the present invention, the table may include a plurality of lookup tables set for respective flow rates of the etching liquid supplied toward the substrate in the center discharging step. The scan velocity determining step may include: a step of searching the plurality of lookup tables, in the ascending order of the respective flow rates of the etching liquid, for the moving velocity of the liquid application position that renders the etching uniformity within acceptable range; a step of stopping the search of the moving velocity of the liquid application position upon finding the moving velocity of the liquid application position that renders the etching uniformity within the acceptable range; and a step of determining that the moving velocity of the liquid application position found in the preceding step as the moving velocity of the liquid application position in the scan step.

In the preferred embodiment of the present invention, the scan velocity determining step may be a step of determining the moving velocity of the liquid application position for each of a plurality of intervals between the edge portion of the principal face of the substrate and the center portion of the principal face of the substrate.

According to this method, scan velocity is determined for each of a plurality of intervals between the edge portion of the principal face of the substrate and the center portion of the principal face of the substrate. Distribution of etching amounts in a case that only the center discharging step is carried out may change at an almost constant rate to a distance in a radial direction of a substrate in some cases, or considerably change in the middle in other cases. Therefore, in spite of such changes, uniformity of etching amounts within substrate face by determining the scan velocity for each of a plurality of intervals.

In the preferred embodiment of the present invention, the scan velocity determining step may determine the moving velocity of the liquid application position for each of a plurality of intervals between the edge portion of the principal face of the substrate and the center portion of the principal face of the substrate according to a table indicating a plurality of moving velocities respectively set for a plurality of intervals between the edge portion of the principal face of the substrate and the center portion of the principal face of the substrate.

Another preferred embodiment of the present invention provides a substrate processing apparatus for processing a substrate comprising: a substrate holding rotating unit for holding the substrate and rotating the substrate about a rotational axis passing through a principal face of the substrate; an etching liquid supply mechanism including a nozzle for discharging an etching liquid toward the principal face of the substrate held by the substrate holding rotating unit; a nozzle moving mechanism for moving a liquid application position, the etching liquid discharged out of the nozzle being applied thereon, within the principal face of the substrate; and a control device for controlling the substrate holding rotating unit, the etching liquid supply mechanism, and the nozzle moving mechanism.

The control device carries out: a scan velocity determining step of determining a moving velocity for moving a liquid application position from an edge portion of the principal face of the substrate to the center portion of the principal face of the substrate according to a supply condition of the etching liquid under a state that the liquid application position is positioned at the center portion of the principal face of the substrate; a scan step of rotating the substrate about an rotational axis passing through the principal face of the substrate and moving the nozzle while discharging the etching liquid such that the liquid application position is moved from the edge portion of the principal face of the substrate to the center portion of the principal face of the substrate; and a center discharging step of rotating the substrate about the rotational axis while continuing the discharge of the etching liquid toward the principal face of the substrate under the state that the liquid application position being positioned at the center portion of the principal face of the substrate. According to this configuration, it is possible to achieve effects similar to the aforementioned effects.

In the another preferred embodiment of the present invention, the control device may determine the moving velocity according to a supply time for supplying the etching liquid toward the substrate under the state that the liquid application position is positioned at the center portion of the principal face of the substrate. According to this configuration, it is possible to achieve effects similar to the aforementioned effects.

In the another preferred embodiment of the present invention, the control device may include a memory device storing a table indicating relationship between the supply time of the etching liquid under the state that the liquid application position is positioned at the center portion of the principal face of the substrate and the moving velocity of the liquid application position. In this case, the control device may determine the moving velocity of the liquid application position according to the table in the scan velocity determining step. According to this configuration, it is possible to achieve effects similar to the aforementioned effects.

In the another preferred embodiment of the present invention, the control device may include a memory device storing a table indicating relationship between the supply time of the etching liquid under the state that the liquid application position is positioned at the center portion of the principal face of the substrate and a moving time of the liquid application position for moving the liquid application position from the edge portion of the principal face of the substrate to the center portion of the principal face of the substrate. In this case, the control device may determine the moving velocity of the liquid application velocity according to the table in the scan velocity determining step. According this configuration, it is possible to achieve effects similar to the aforementioned effects.

In the another preferred embodiment of the present invention, the table may indicate an etching uniformity when the scan step and the center discharging step are carried out at the moving velocity determined according to the table. The scan velocity determining step may include a step of determining, prior to the scan step and the center discharging step, whether the etching uniformity is within an acceptable range.

In the another preferred embodiment of the present invention, the table includes a plurality of lookup tables set for respective flow rates of the etching liquid supplied toward the substrate in the center discharging step. The scan velocity determining step may include: a step of searching the plurality of lookup tables, in the ascending order of the respective flow rates of the etching liquid, for the moving velocity of the liquid application position that renders the etching uniformity within acceptable range; a step of stopping the search of the moving velocity of the liquid application position upon finding the moving velocity of the liquid application position that renders the etching uniformity within the acceptable range; and a step of determining by regarding the moving velocity found in the preceding step as the liquid application position in the scan step.

In the another preferred embodiment of the present invention, the control device may determine the moving velocity of the liquid application position for each of a plurality of intervals between the edge portion of the principal face of the substrate and the center portion of the principal face of the substrate in the scan velocity determining step. According to this configuration, it is possible to achieve effects similar to the aforementioned effects.

In the another preferred embodiment of the present invention, the control device may include: a table storing a plurality of moving velocities respectively set for a plurality of intervals between the edge portion of the principal face of the substrate and the center portion of the principal face of the substrate; and determines the moving velocity of the liquid application position for each of the plurality of intervals between the edge portion of the principal face of the substrate and the center portion of the principal face of the substrate according to the table in the scan velocity determining step.

The aforementioned or other objects, features and effects of the present invention shall be clarified by the following description of the preferred embodiments with references to the accompanying drawings.

BRIEF DESCRIPTION OF THE DRAWINGS

FIG. 11 is a table showing an example of a lookup table stored in the control device.

FIG. 12 is a table showing another example of a lookup table stored in the control device.

DETAILED DESCRIPTION OF THE PREFERRED EMBODIMENTS

Figure 1:
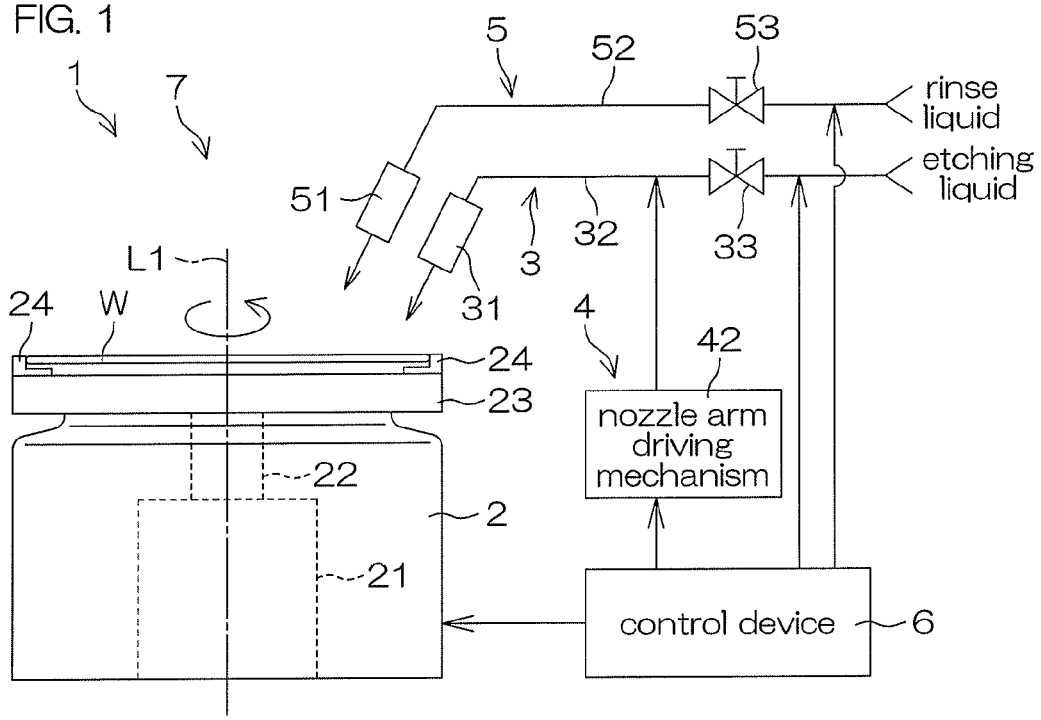
FIG. 1 is a schematic horizontal view of an interior configuration of a process chamber provided in a substrate processing apparatus in accordance with a first embodiment of the present invention.
Figure 2:
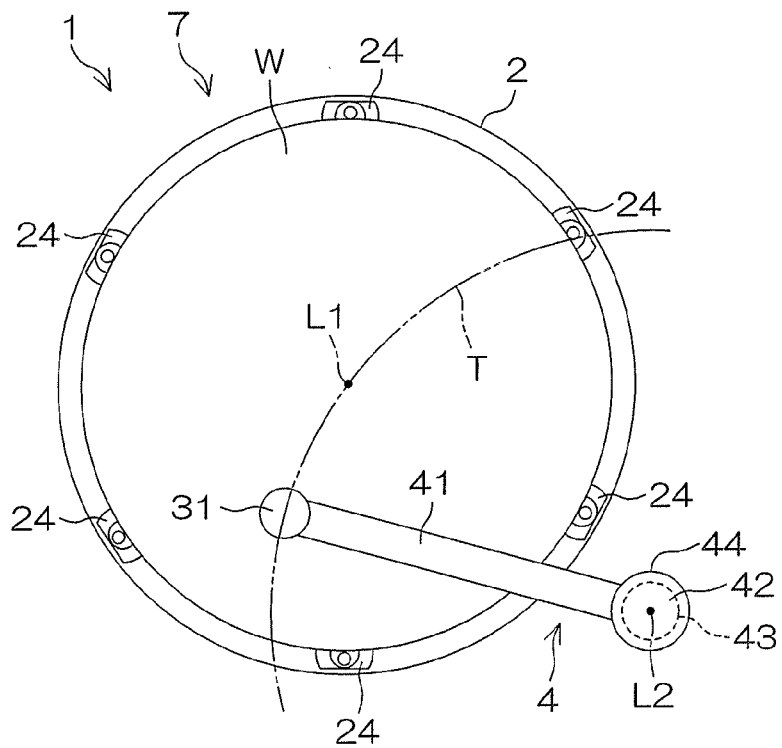
FIG. 2 is a schematic plan view of a spin chuck in accordance with the first embodiment of the present invention.
Figure 3:
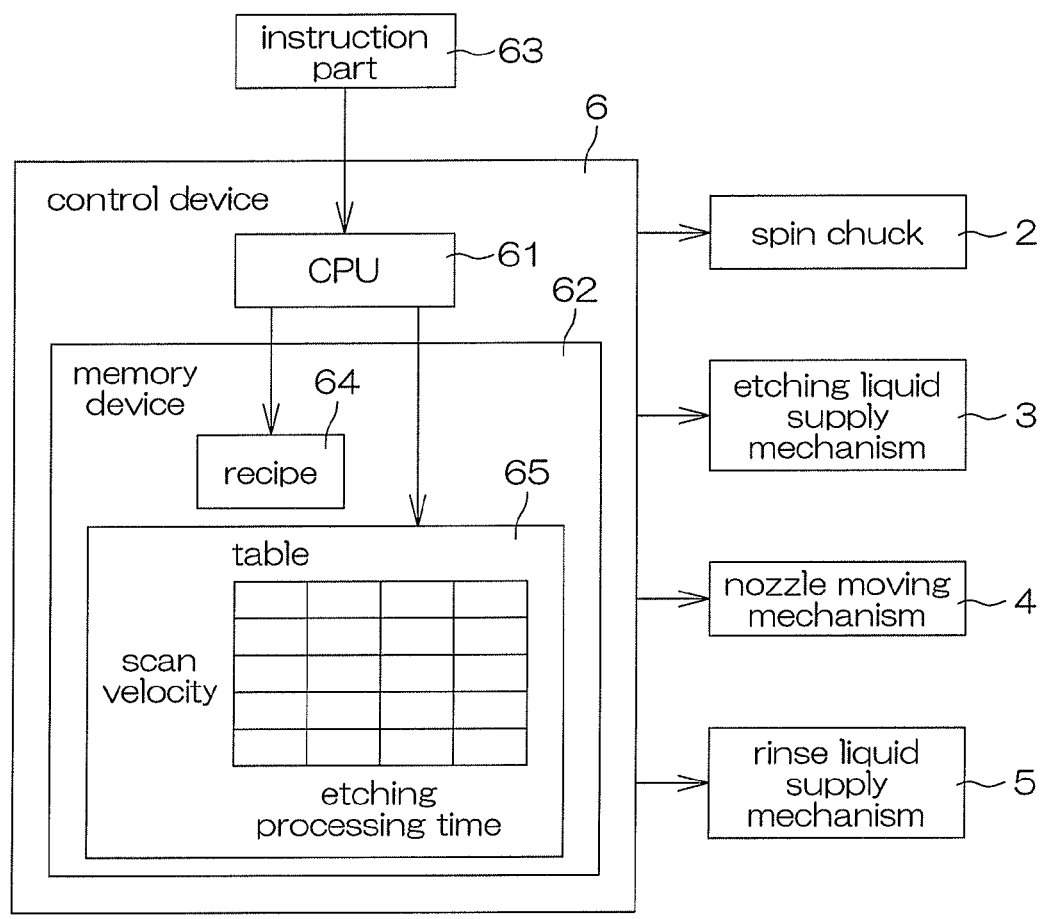
FIG. 3 is a block diagram for illustrating a functional configuration of a control device in accordance with the first embodiment of the present invention.

FIG. 1 is a schematic horizontal view of an interior configuration of a process chamber provided in a substrate processing apparatus in accordance with a first embodiment of the present invention. FIG. 2 is a schematic plan view of a spin chuck in accordance with the first embodiment of the present invention. FIG. 3 is a block diagram for illustrating a functional configuration of a control device in accordance with the first embodiment of the present invention.

Substrate processing apparatus 1 is a sheet-type apparatus for processing disk-shaped substrates W such as semiconductor wafers one sheet at a time. A principal face of the substrate W, on which processing are carried out, may be a surface as a device forming face or reverse face as another face on which no device is formed. Hereinbelow will be explained an example of processing of a surface of a substrate W.

The substrate processing apparatus 1 comprises a spin chuck 2 (substrate holding rotating unit), etching liquid supply mechanism 3, nozzle moving mechanism 4, rinse liquid supply mechanism 5 and control device 6. The spin chuck 2 is contained in the interior of a process chamber 7 divided by a wall (not shown).

The spin chuck 2 comprises a motor 21 for rotating the substrate W, a tubular rotational axis 22 extending vertically from the motor 21, a spin base 23 attached on the upper end of the rotational axis 22 and a plurality of substrate pinching units arranged to horizontally pinch the substrate W at above the spin base 23.

The lower end of the rotational axis 22 is attached to the motor 21. Therefore, driving of the motor 21 causes the spin base 23 and the substrate W held thereby to rotate integrally about a rotational axis L1 vertically passing through the center of the substrate W. Additionally, whereas in this embodiment the spin chuck 2 that is pinch-hold type and horizontally holds a substrate W by pinching horizontally the substrate W with the plurality of substrate pinching units is shown as an example, the spin chuck 2 may be a vacuum-type chuck that holds the lower face (reverse face) of a substrate W by way of suction.

The etching liquid supply mechanism 3 comprises an etching liquid nozzle 31, an etching liquid supply pipe 32 and an etching liquid valve 33. The etching liquid supply pipe 32 is connected to the etching liquid nozzle 31. The etching liquid valve 33 is interposed on the etching liquid supply pipe 32.

When the etching liquid valve 33 is opened, an etching liquid is supplied to the etching liquid nozzle 31 via the etching liquid supply pipe 32. Also, when the etching liquid valve 33 is closed, the supply of the etching liquid to the etching liquid nozzle 31 via the etching liquid supply pipe 32 is stopped. Etching liquid discharged out of the etching liquid nozzle 31 is supplied toward the top face (upper face) of the substrate W held by the spin chuck 2.

Etching liquids supplied toward a substrate W by the etching liquid supply mechanism are liquids containing hydrogen fluoride (hydrofluoric acid) or DHF (Dilute Hydrogen Fluoride) or the like. Etching liquids are not limited to hydrogen fluoride nor DHF, and may be any of one of TMAH (Trimethylphenylammonium hydroxide), BHF (buffered Hydrogen Fluoride) and SC-1 (Ammonia-Hydrogen Peroxide mixture).

The nozzle moving mechanism 4 comprises a nozzle arm 41 and a nozzle arm driving mechanism 42 for driving the nozzle arm 41. The nozzle arm driving mechanism 42 further includes a rotational movement motor 43 and a nozzle arm pivot 44 rotatably attached to the rotational motor 43 (see FIG. 2). Driving power of the rotational motor 43 is transmitted via the nozzle arm pivot 44.

One end of the nozzle arm 41 is rotatably attached to be coupled with the nozzle arm pivot 44. Another end of the nozzle arm 41 holds the etching nozzle 31. Driving of the rotational movement motor 43 causes the nozzle arm 41 to be rotationally moved about a rotational movement axis L2. As a result of this, the etching liquid nozzle 31 is also rotated about the rotational movement axis L2 in response to the rotational movement of the nozzle arm 41.

As is shown in FIG. 2, the nozzle moving mechanism 4 moves the nozzle arm 41 and the etching liquid nozzle 31 so that liquid application position is moved along an arcuate locus T that crosses the edge portion and the center portion of the top face of the substrate W in planar view. Further, the nozzle moving mechanism 4 moves the nozzle arm 41 and the etching liquid nozzle 31 so that the nozzle arm 41 and the etching liquid nozzle 31 are moved back and forth between a given retreatment position interior of the process chamber 7 and an area opposing the top face of the substrate W.

The rinse liquid supply mechanism 5 comprises a rinse liquid nozzle 51, a rinse liquid supply pipe 52, and a rinse liquid valve 53. The rinse liquid supply pipe 52 is connected to the rinse liquid nozzle 51. The rinse liquid valve 53 is interposed on the rinse liquid supply pipe 52.

When the rinse liquid valve 53 is opened, rinse liquid is supplied via the rinse liquid supply pipe 52 to the rinse liquid nozzle 51. Also, when the rinse liquid valve 53 is closed, the supply of the rinse liquid to the rinse liquid nozzle 51 via the rinse liquid supply pipe 52 is stopped. Rinse liquid discharged out of the rinse liquid nozzle 51 is supplied toward the center portion of the top face of the substrate W held by the spin chuck 2.

As rinse liquids supplied toward the substrate W by the rinse liquid supply mechanism 5, carbonated water, electrolytically ionized water and the like can be exemplified.

As is shown in FIG. 3, the control device 6 comprises a CPU 61 (central processing unit 61) and a memory device 62, and connected to an instruction part 63. Also, the control device 6 is connected to the spin chuck 2, the etching liquid supply mechanism 3, the nozzle moving mechanism 4, and the rinse liquid supply mechanism 5. The CPU 61 exercises various functions by sequentially carrying out programs stored in the memory device 62. Also, in response to input signals from the instruction part 63, the CPU 61 causes the memory device 62 to store data therewithin.

The CPU 61 reads data stored in the memory device 62 and sends instructions to each of the spin chuck 2, the etching liquid supply mechanism 3, the nozzle moving mechanism 4, and the rinse liquid supply mechanism 5. More specifically, the CPU 61 sends instructions on rotational movement of the motor 21 and stop thereof, and instructions on pinching of the substrate W and release thereof. Meanwhile the CPU 61 controls rotational velocity, rotation time, rotational angle and the like. Also the CPU 61 sends instructions on supplying of etching liquid and stop thereof and the like to the etching liquid supply mechanism 3. Meanwhile the CPU 61 controls supply time (etching processing time) of etching liquid, flow rate of etching liquid and the like. Also the CPU 61 sends instructions on rotational movement of the nozzle arm 41 and stop thereof and the like. Meanwhile the CPU 61 controls rotational velocity, rotation time, and range of rotational movement (rotational movement angle) and the like. And the CPU 61 sends instructions on supplying of rinse liquid and stop thereof and the like. Meanwhile the CPU 61 controls supply time and flow rate of rinse liquid and the like.

As shown in FIG. 3, a recipe 64 indicating processing conditions for substrate W is stored in the memory device 62. Further, a table 65 indicating relationship between etching process time and scan flow rate is stored in the memory device 62.

The recipe 64 is a control program for executing a given substrate processing steps. For example, a plurality of conditions indicated in the recipe 64 includes two or more of the following: rotational velocity, rotation time, and rotational angle of the motor 21; etching processing time; flow rate of etching liquid; rotational movement velocity, rotational time, and range of rotational movement of the nozzle arm 41; supply time and flow rate of rinse liquid; and the like.

Figure 4:
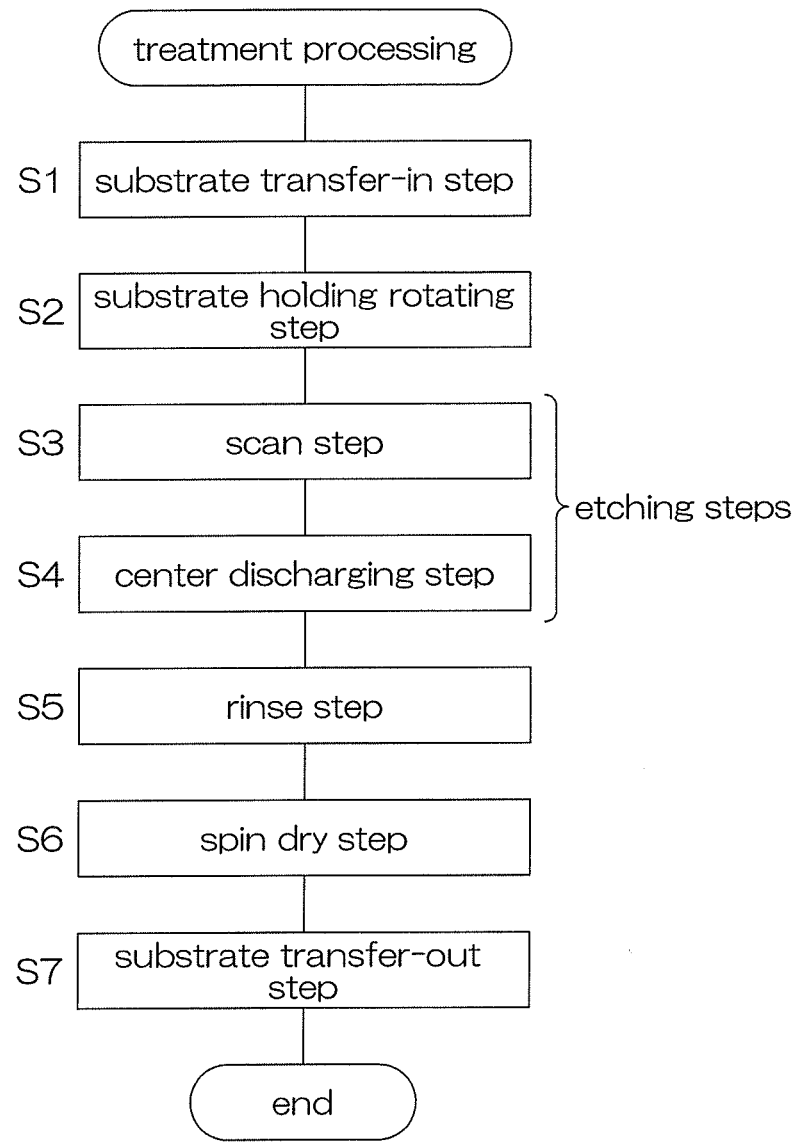
FIG. 4 is a step diagram for illustrating an example of processing steps of a substrate carried out by the substrate processing apparatus in accordance with the first embodiment of the present invention.

FIG. 4 is a step diagram for illustrating an example of processing steps of a substrate carried out by the substrate processing apparatus in accordance with the first embodiment of the present invention.

The substrate W to be processed is transferred from a substrate transfer robot (not shown) to the spin chuck 2 while rotation of the spin chuck 2 is controlled to be stopped. The substrate W is mounted horizontally above the spin base 23, on the substrate pinching units 24 so as to be surrounded by them (substrate transfer-in step or step S1). Thereafter, as the substrate transfer robot retreats, the substrate W is pinches by the substrate pinching units 24. And then the motor 21 of the spin chuck 2 is activated and the spin base 23 and the substrate W are rotated integrally about the rotational axis L1 (substrate holding rotating step or step S2).

After the start of the rotation of the spin base 23 and the substrate W, the nozzle arm 41 is rotationally moved from a given retreat position inside the process chamber 7 toward an edge portion of the top face of the substrate W. Then when the etching liquid nozzle 31 is positioned at a position where the etching liquid nozzle 31 opposes the edge portion of the top face of the substrate W, the etching liquid valve 33 is opened to start dispensing of an etching liquid toward the edge portion of the top face of the substrate W. The etching liquid nozzle 31 is rotationally moved from the position where the etching liquid nozzle 31 vertically opposes the edge portion of the top face of the substrate W and a position where the etching liquid nozzle 31 vertically opposes the center portion of the top face of the substrate W at a given rotational velocity (scan velocity). Accordingly an etching liquid application position is rotationally moved from the edge portion to the center portion of the top face of the substrate W at a given scan velocity. Thereby etching processing for the top face of the substrate W is carried out (scan step or step S3).

After the scan step is carried out at a given velocity, the etching liquid nozzle 31 continues discharging of the etching liquid at a position opposing the center portion of the top face of the substrate W for a given time. In other words, etching processing is carried out for the top face of the substrate W in a condition that the etching liquid application position is positioned at the center portion of the top face of the substrate W (center discharging step, or step S4).

The etching liquid supplied toward the top face of the substrate W in the scan step and the center discharging step is spread from the center portion toward the edge portion of the top face of the substrate W by centrifugal forces accompanied by the rotation of the substrate W. Then etching processing of the whole area of the top face of the substrate W is carried out through chemical reactions by the etching liquid (etching step).

After the center discharging step carried out for a given time, the etching liquid valve 33 is closed and the discharging of the etching liquid from the etching liquid nozzle 31 is finished. Next, the nozzle arm 41 rotationally moves to retreat from the center portion of the top face of the substrate W toward a given retreat position in the interior of the process chamber 7. After supply of etching liquid toward the substrate W is stopped, a rinse liquid is supplied from the rinse liquid nozzle 51 toward the center portion of the top face of the substrate W by opening of the rinse liquid valve 53. The supplied rinse liquid is spread over the whole area of the top face of the substrate W by centrifugal forces accompanied by the rotation of the substrate W, the rinse liquid replacing and washing away the etching liquid for the whole area of the top face of the substrate W (rinse step, or step S5).

After supplying the rinse liquid for a given time for rinse processing, the rinse liquid valve 53 is closed and supplying of the rinse liquid is stopped. Then the spin base 23 is accelerated up to a rotational velocity faster than that in the etching step or the rinse step. Liquids adhered to the substrate W is swung off to its surrounding as a result of the fast rotation of the substrate W. Thus is carried out a drying step (spin dry step, or step S6), and the substrate W is dried.

After the spin dry step is carried out for a given time for dry processing, the revolution of the spin chuck 2 is stopped. After the stop of the spin chuck 2, the pinching of the substrate W by the substrate pinching units 24 is released. Thereafter the substrate W above the spin chuck 2 is lifted up by the substrate transfer robot (not shown) and transferred out of the process chamber 7 (substrate transfer-out step, or step S7).

Figure 5:
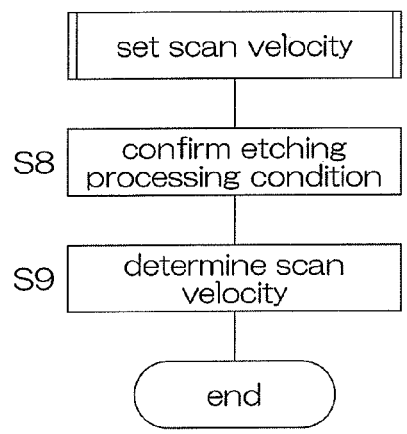
FIG. 5 is a step diagram for illustrating an example of steps of setting scan velocity in accordance with the first embodiment of the present invention.

FIG. 5 is a step diagram for illustrating an example of steps of setting scan velocity in accordance with the first embodiment of the present invention.

An etching processing time for supplying an etching liquid toward the substrate W, that is, a time for discharging the etching liquid from the etching liquid nozzle 31 toward the substrate W is set or changed by manipulating the instruction part 63 (for example, a display/input device such as a touch panel).

For example, when the etching processing time is changed, the CPU 61 in the control device 6 confirms the etching processing condition for the etching processing time after the change (processing condition confirming step, or STEP S8).

Figure 9:
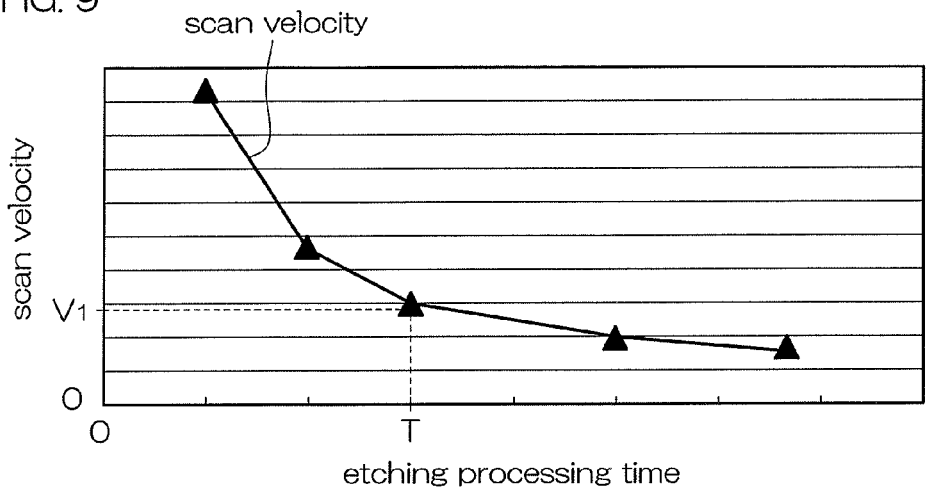
FIG. 9 is a graph showing relationship between etching processing time and scan velocity in accordance with the first embodiment of the present invention.

In the memory device 62 in the control 6, optimum scan velocities determined by a method which will be described later are stored as the table 65 (see FIG. 3). Relationship between etching processing time and optimum scan velocity is stored as a string of data for improving etching uniformity to the extent possible. An example of optimum values are shown in FIG. 9 (will be described later). The CPU 61 determines the scan velocity (the moving velocity of the liquid application position of etching liquid toward the top face of the substrate W) that corresponds to the changed etching processing time, by selection referring to the table 65 (scan velocity determining step, or step S9).

Then the CPU 61 replaces the scan velocity already set in the recipe 64 with the selected scan velocity. Therefore the aforementioned exemplary processing steps of the substrate W is carried out in a condition where scan velocity is set at an appropriate value corresponding to etching processing time.

The values indicated in the table 65 are values determined according to etching processing time, and are set based on the distribution of etching amounts under the condition that only the center discharging step is carried out (more specifically, the distribution of etching amount differences between the center portion and the edge portion). For this reason, hereinbelow will be explained the distribution of etching amount under the condition that only the center discharging step is carried out.

Figure 6:
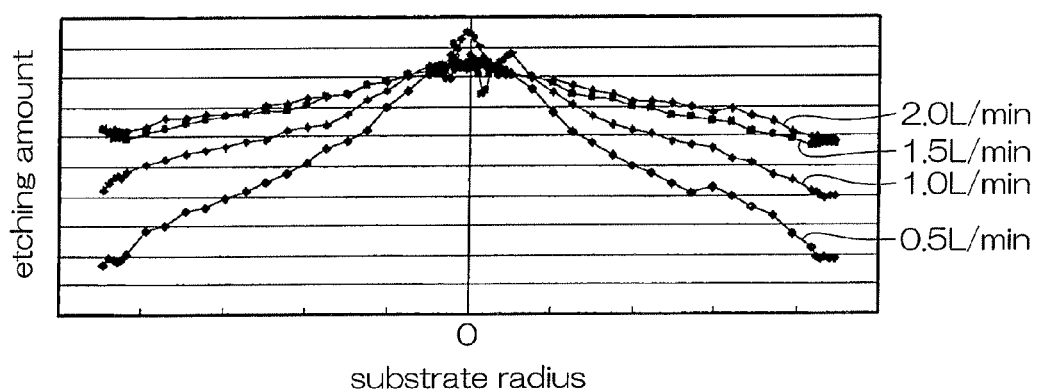
FIG. 6 is a graph showing distribution of etching amounts on a surface of a substrate in accordance with the embodiment of the present invention.

FIG. 6 is a graph showing distribution of etching amounts on a top face of a substrate in accordance with the embodiment of the present invention.

The graph in FIG. 6 shows distribution of etching amounts on a top face of a substrate, changing flow rate of an etching liquid. Four strings of measurement values each drawn in broken lines represent a distribution of etching amounts on a top face of a substrate in changing only flow rate of the etching liquid under the same etching condition. The flow rates of the four measurement values are, respectively, 2.0 L/min, 1.5 L/min, 1.0 L/min, and 0.5 L/min. Each of the string of broken lines is a connected line of etching amounts at a plurality of common positions spread along a diameter of the substrate W.

According to the four strings of measurement values in FIG. 6, in every conditions, etching amounts at a center portion of a top face of a substrate W are greater than those at an edge portion. Also, with regards to etching amounts at a center portion of a top face of a substrate W, differences among the four strings of measurement values are not prominent. On the other hand, with regards to etching amounts at an edge portion of the top face of the substrate W, as flow rate of etching liquids increases, etching amounts becomes greater. That is to say, etching amounts at an edge portion of a substrate W is the highest when the flow rate of the etching liquid is 2.0 L/min, and etching amounts at an edge portion of the substrate W is the lowest when the flow rate of the etching liquid is 0.5 L/min.

According to the graph in FIG. 6, etching amounts almost linearly decreases along a line from the center portion to the edge portion of the top face of the substrate W. That is, the amount of etching increases, in a concentric manner, from the edge portion toward the center portion.

Also, it is noted that as flow rate of an etching liquid becomes lower (liquid saving), etching amounts of an edge portion of a top face of a substrate W decrease more than etching amounts of a center portion of the top face of the substrate W. Accordingly, it is noted that when adapting liquid saving, differences of etching amounts between the center portion and the edge portion of the top face of the substrate W becomes higher, lowering the uniformity of etching.

Figure 7:
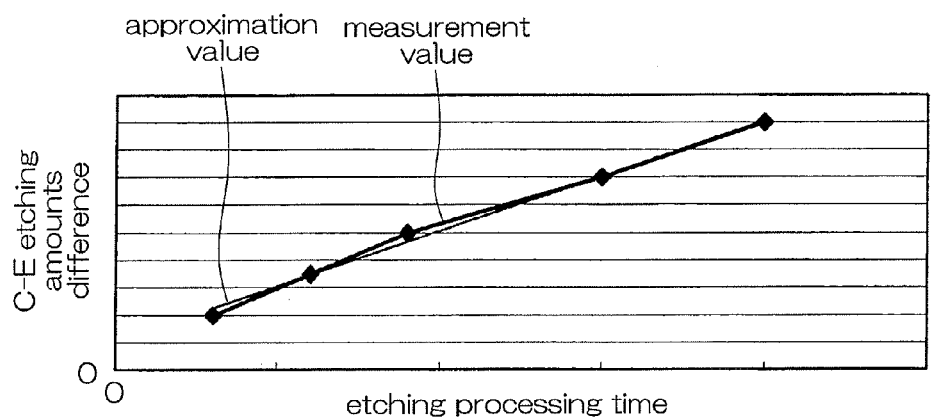
FIG. 7 is a graph showing relationship between etching processing time and differences in etching amounts between those of a center portion and an edge portion of a substrate.

FIG. 7 is a graph showing relationship between etching processing time and difference in etching amounts between those of a center part and an edge part of a substrate. The graph in FIG. 7 shows the changes of the differences in etching amounts between the center portion and the edge portion (C-E etching amounts difference). In FIG. 7, the longitudinal axis indicates C-E etching amounts difference and the horizontal axis indicates etching process time. In FIG. 7, measurement values (values actually measured) of C-E etching amounts difference when flow rate of an etching liquid is fixed at 0.5 L/min, and approximate values, and linear approximation values thereof are shown. Incidentally, this approximated linear line is derived by applying least square method on the measurement values.

According to the graph in FIG. 7, C-E etching amounts difference increases at an almost constant rate as the increase of etching process time when only the center discharging step is carried out. That is, relationship between differences in C-E etching amounts and etching process time is substantially linear. Therefore it is possible to calculate C-E etching amounts difference at any etching process time.

As described, because the relationship between C-E etching amounts difference and etching process time is substantially linear as described, the control 6 makes uniform etching of the whole area of a top face of a substrate W possible by changing scan velocity in accordance with etching process time. For example, when an etching process time is increased, C-E etching amounts difference is also increased. In such a case, the control device 6 can achieve uniform etching of the whole area of a top face of a substrate W by slowing down scan velocity. Also, when an etching process time is decreased, C-E etching amounts difference is also decreased. In such a case, the control device 6 can achieve uniform etching of the whole area of a top face of a substrate W by speeding the scan velocity.

As described, when only the center dispensing step, wherein a liquid application position is fixed at a center portion of a top face of a substrate W, is carried out, etching amounts becomes higher at the center portion than at a edge portion of the substrate W. On the other hand, when only the scan step, wherein a liquid application position is moved from an edge portion to a center portion of a substrate W, is carried out, etching amounts becomes lower at the center portion than at the edge portion of the substrate W. Therefore, when both the center dispensing step and the scan step are carried out, the C-E etching differences resulted from the center discharging step and the C-E etching differences resulted from the scan step are offset with each other, enhancing the etching uniformity.

Figure 8:
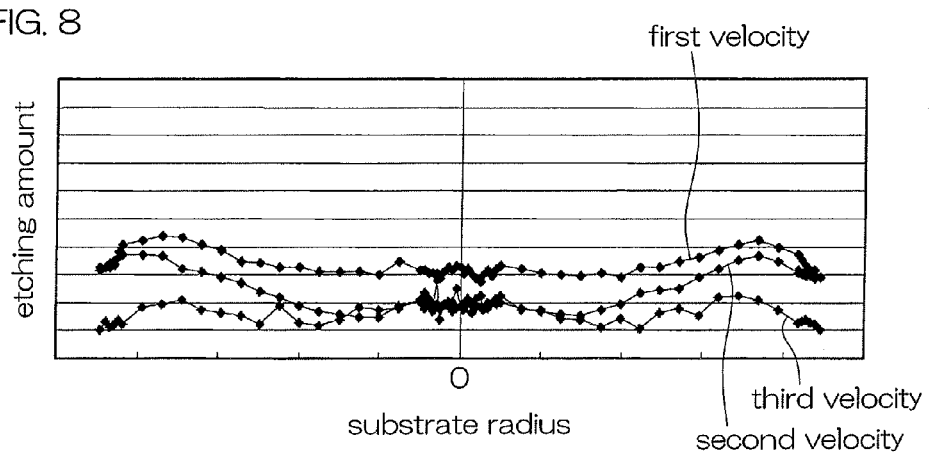
FIG. 8 is a graph showing distribution of etching amounts on a surface of a substrate when the scan step and the center discharging step are carried out in accordance with the first embodiment of the present invention.

FIG. 8 is a graph showing distribution of etching amounts on a surface of a substrate when the scan step and the center discharging step are carried out in accordance with the first embodiment of the present invention. In FIG. 8, the longitudinal axis indicates etching amounts of a top face of a substrate W and the horizontal axis indicates distance on a substrate W in a radial direction, the center of the substrate W being the reference point.

Flow rate of an etching liquid in the scan step and the center dispensing step is set as 0.5 L/min as for the three strings of measurement values each drawn in broken lines in FIG. 8. And scan velocities for the three strings of measurement values are, respectively, first velocity, second velocity, and third velocity. The first velocity is slower than the second velocity, the second velocity is slower than the third velocity (first velocity<second velocity<third velocity). Each of the string of broken lines is a connected line of etching amounts at a plurality of common positions spread along a diameter of the substrate W.

As is apparent from the comparison between FIG. 6 and FIG. 8, improvements of etching uniformity can be acknowledged for any one of the cases in FIG. 8 wherein both the scan step and the center dispensing step are carried out, over the cases in FIG. 6 wherein only the center dispensing step is carried out. In other words, a top face of a substrate is planarized more so when carrying out the scan step at a scan velocity determined according to etching process time than only the center dispensing step is carried out.

Also, as shown in FIG. 8, the etching uniformity in a case when the scan step is carried out with either the first velocity or the second velocity, is worse than that in a case when the scan step is carried out with the third velocity. This may be considered that because both the first and the second velocity is slower than the optimum value, etching amounts at the edge portion of the top face of the substrate W is increased, resulting in a reverse and deterioration of C-E etching amounts differences. Accordingly, with the third velocity, which is faster than either the first or the second velocity, the etching uniformity is improved.

FIG. 9 is a graph showing relationship between etching processing time and scan velocity in accordance with the first embodiment of the present invention.

The broken lines shown in FIG. 9 represent relationship between etching process time when etching is carried out uniformly in the processing steps shown in FIG. 4, and scan velocity. The broken lines in FIG. 9 is stored in the control device 6 (memory device 62) as table data constituting a table 65. That is, the table 65 is prepared based on the broken lines in FIG. 65.

It is shown in FIG. 9 that when etching process time T is selected, scan velocity having the best etching uniformity is V1. Also, scan time T1 is calculated based on the scan velocity V1 and moving distance of liquid application position (that is equal to the radius of the substrate W). And by subtracting the scan time T1 from the etching process time T, center discharging time T2 (=T−T1) corresponding to the scan velocity can be obtained. Thus by adapting the values listed in the table 65 as etching process time and scan velocity, center discharging time corresponding to the optimum scan velocity can be obtained.

By the way, etching process time and scan time may be stored in the control device 6 as the table 65. In this case, scan velocity is calculated based on the table 65 indicating relationship between the etching process time and the moving time of etching liquid application position.

As is shown in FIG. 6, by increasing flow rate of etching liquid supplied toward a top face of a substrate W, etching amounts differences between the center portion and the edge portion (C-E etching amounts differences) is decreased, while etching amounts at the center portion are almost constant, resulting in improvement of etching uniformity. On the other hand, there are needs to decrease the consumption of process liquid such as chemical liquids or the like. Therefore, it is required to find a point of compromise regarding these contradicting requirements (improvement on uniformity and decrease of consumption amounts).

In some cases, when flow rate is different, the relationship between T-V1 (relationship between etching process time and scan velocity) in FIG. 9 may vary. For this reason, the controller 6 stores a plurality of tables 65 (lookup tables) set for respective flow rates of the etching liquid as shown in FIG. 3. Each of the tables 65 is prepared based on the T-V1 equation experimentally obtained.

For example, when a flow rate of an etching liquid is given, the control device 6 refers to a lookup table storing a T-V1 curve corresponding to the flow rate of the etching liquid.

As is shown in FIG. 11, each of the lookup tables lists T-V1 data (etching processing time and respective scan velocities) therein. It is desirable that each of the lookup tables lists measurements data on etching uniformity δ. The etching uniformity δ is an experimental value obtained at a time when treatment processing steps shown in FIG. 4 are carried out at a scan velocity V1 obtained from the T-V1 curve. An etching uniformity δ is a value obtained by subtracting a minimum value of etching amount from a maximum value of etching amount, or a deviation.

If an etching uniformity δ is listed in a lookup table, it is possible for the control device 6 to determine whether a treatment processing that is to be carried out at a certain scan velocity meets desired uniformity requirements, prior to the execution of the treatment processing.

Specifically, when a flow rate of an etching liquid is not provided beforehand, the control device 6 figures out a uniformity δ corresponding to a given etching processing time T by referring to a lookup table listing T-V1 data for a low flow rate (for example, 0.5 L/min). If the uniformity δ does not fall within an acceptable range (not within a range requested by user), the control device 6 further seeks to find another uniformity δ by referring to a look up table listing T-V1 data for a higher flow rate (for example, 4 L/min). Operations likewise are repeated until a uniformity δ satisfying the condition for the acceptable range.

The control device 6 stops the search of a scan velocity upon finding a scan velocity with which the etching uniformity δ falls within the acceptable range. Then the control 6 determines that the found scan velocity as a scan velocity in the scan step (step S3 in FIG. 4). Therefore it is possible to decrease consumption amounts of etching liquids while improving etching uniformity.

As is described hereinabove, it is possible to determine a scan time and a condition for scan time (scan condition) by looking up a distribution of etching amounts on a top face of a substrate W in the center discharging step. As a result, it is possible to carry out an etching treatment of high uniformity.

Also, it is possible to calculate a scan condition for each of the variations of conditions such as: a flow rate, density, or temperature of an etching liquid, rotational velocity, planar dimension, or size of a substrate W, or the like as respective sets of conditions, by looking up a distribution of etching amounts in the center discharging step corresponding to the variation of condition. As a result, it is possible to adapt the present method for broad range of etching conditions. Thereby it is possible to carry out an etching processing of high uniformity over the whole area of a top face of a substrate W under broad range of etching conditions.

Moreover, being capable of storing the optimized scan conditions and center discharging conditions in the memory device 62, the control device 6 can uniformly process each of a plurality of substrates W by retrieving the conditions stored in the memory device 62.

Although the preferred first embodiment of the present invention has been described hereinabove, it should be clear for those skilled in the art that the present invention may not be limited by the content of aforementioned first embodiment and that the present invention can be put into practice with various modifications within the scopes of the invention defined in the appended claims.

For example, while an explanation is made as for a case in the scan step in the first embodiment that an etching liquid nozzle 31 is moved horizontally along a nozzle moving mechanism 4 along an arcuate locus T by a nozzle moving mechanism 4, the nozzle moving mechanism 4 may move the etching liquid nozzle 31 along an horizontally extending line.

Also, while an explanation is made as for a case in the first embodiment that a liquid application position is moved within a top face of a substrate W by moving an etching liquid nozzle 31 horizontally along a along an arcuate locus T by a nozzle moving mechanism 4, the nozzle moving mechanism 4 may move the liquid application position between a center portion and an edge portion of the top face of the substrate W by swinging a lower end part of the etching nozzle 31. In other words, the liquid application position may be moved by either movement of the etching nozzle 31 as a whole or change of posture of the etching liquid nozzle 31.

Also, while an explanation is made as for a case in the scan step in the first embodiment that an etching liquid nozzle 31 is moved by a nozzle moving mechanism 4 such that a liquid application position for a top face of a substrate W is moved at a given moving velocity, the moving velocity of the liquid application position (scan velocity) may be changed along the way toward a center portion of the top face of the substrate W. In other words, separate scan velocities may be determined for a plurality of respective intervals between the edge portion and the center portion of the top face of the substrate W.

Figure 10:
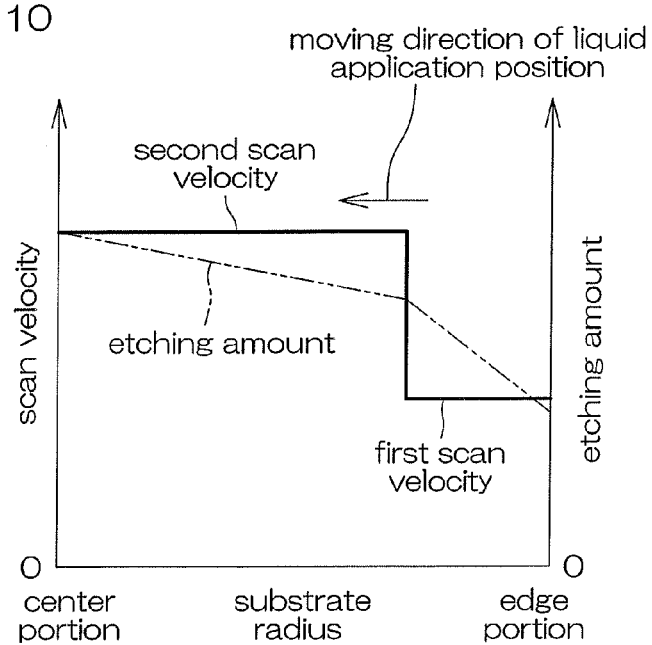
FIG. 10 is a graph for illustrating scan velocity in accordance with another embodiment of the present invention.

Specifically, as is shown in FIG. 10, the nozzle moving mechanism 4 may move the etching liquid nozzle 31 such that a liquid application position is moved at a first moving velocity over the edge portion on the top face of the substrate W and subsequently moved at a second moving velocity faster than the first moving velocity to the center portion of the top face of the substrate W. Distribution of etching amounts in a case that only the center discharging step is carried out may change at an almost constant rate to a distance in a radial direction of a substrate in some cases as is shown in FIG. 6, or considerably change in the middle in other cases. In such cases, the controller 6 can assuredly enhance uniformity of etching amounts within a face of a substrate W by determining the scan velocity for each of a plurality of intervals.

Additionally, while an example is shown in which separate moving velocities (scan velocity) are assigned for two intervals between the center portion and the edge portion of a top face of a substrate W, separate moving velocities (scan velocity) may be assigned for three intervals therebetween.

Hereinafter, "one-step scan" shall refer to maintaining of a scan velocity between an edge portion Re and a center portion Rc of a substrate, and "multi-step scan" shall refer to changing of a scan velocity between an edge portion Re and a center portion Rc of a substrate. Typical example of a multi-scan is a two-step scan in scan velocity experience change only once (see FIG. 10). As is shown in FIG. 10, each of the scan velocities, before or after the change, is constant.

Needs for multiple-step scan are deemed to exist in manufacturing processes for semiconductor devices, liquid crystal display devices and the like.

Specifically, depending on types of thin films to be etched, there are cases where considerable degree of changes of etching amounts occur in the neighborhood of the edge portion of a substrate are observed. Also, in a case of large types of substrate having a longer diameter (for example, 450 mm), because of the radius longer than normal, the edge portion of a substrate is considerable affected by centrifugal forces or temperature drop working thereon. Therefore, when etching a substrate formed with a film with considerably varying etching amounts or a large substrate, using the one-step scan sometimes may not yield a desired uniformity.

In such a case, the control device 6 carries out treatment processing as follows, for example.

Specifically, first, the controller 6 determines according to information on the types of film and processing liquid, out of one-step scan and two-step scan which scan to be carried out. The determining information is listed in a lookup table. Also, values for the determining information are obtained through experiments.

When a two-step scan is determined as to be required, the control device 6 determines a velocity changing position Rm, a first scan velocity V1, and a second scan velocity V2. The velocity changing position Rm is a position on a top face of a substrate, at which position scan velocity changes. The first scan velocity V1 is a constant scan velocity from an edge portion Re of the substrate to the velocity changing position Rm. The second scan velocity V2 is a constant scan velocity from the velocity changing position Rm to the center portion Rc of the substrate.

First, the control device 6 determines a velocity changing position Rm according to the substrate size (for example, 300 mm or 400 mm of diameter) by referring a lookup table.

Next, the control device 6 determines a first scan velocity V1 and a second scan velocity V2 by referring a lookup table shown in FIG. 12. The lookup table shown in FIG. 12 indicates relationships concerning a plurality of etching processing time T, first scan velocities V1, and second scan velocities V2.

In a case that etching processing time is T=T2, the control device 6 determines that the value of the first scan velocity V1 be the fixed value represented as V12, and that the value of the second scan velocity V2 be the fixed value represented as V22.

Also, in a case that etching processing time is T=X (T1<X<T2), the control device 6 calculate a value between V11 and V12 by interpolating values of V11 and V12, and substitute the calculated value for the first scan velocity V1. Likewise, the control device 6 calculate a value between V21 and V22 by interpolating values of V21 and V22, and substitute the calculated value for the second scan velocity V1.

Because etching processing time may increase/decrease according to specifics of the processing, it is difficult to list values in lookup table for all conceivable etching conditions. Therefore calculating values such as the first scan velocity V1 or the like by interpolation makes it possible to adapt to the variety of conditions.

Further, it is possible to implement various changes onto the embodiment within the limitation of the appended claim.

Although the preferred embodiment of the present invention has been described in detail, the embodiment is merely a specific example used to clarify the technical contents of the present invention, and the present invention should not be understood as being limited to this specific example; and the scope of the present invention be limited solely by the appended claims.

The present application corresponds to Japanese Patent Application No. 2013-004732 filed in the Japan Patent Office on Jan. 15, 2013, and Japanese Patent Application No. 2013-234958 filed in the Japan Patent Office on Nov. 13, 2013, the entire disclosure of which is incorporated herein by reference.

What is claimed is:

1. A substrate processing method for processing a substrate comprising:

a scan step of rotating the substrate about a rotational axis passing through a principal face of the substrate and moving a nozzle while discharging an etching liquid therefrom such that a liquid application position of the discharged etching liquid on the substrate is moved from an edge portion of the principal face of the substrate to a center portion of the principal face of the substrate, wherein etching amounts of the substrate are higher at the edge portion than at the center portion of the substrate; and a center discharging step of rotating the substrate about the rotational axis while continuing the discharge of the etching liquid toward the principal face of the substrate, under the state that the liquid application position has reached the center portion of the principal face of the substrate and the nozzle has stopped moving, such that etching amounts of the substrate are higher at the center portion than at the edge portion of the substrate; and a scan velocity determining step of determining a moving velocity for the scan step, for moving the liquid application position from the edge portion to the center portion, according to a supply condition of the etching liquid under the state that the liquid application position is fixed at the center portion of the principal face of the substrate, wherein the supply condition of the etching liquid includes at least one of: etching liquid density, etching liquid temperature, supply time for etching liquid, and etching liquid type.

2. The substrate processing method according to claim 1, wherein the scan velocity determining step is a step of determining the moving velocity according to a supply time for supplying the etching liquid toward the substrate under the state that the liquid application position is positioned at the center portion of the principal face of the substrate.

3. The substrate processing method according to claim 2, wherein the scan velocity determining step is a step of determining the moving velocity of the liquid application position according to a table indicating relationship between the supply time of the etching liquid under the state that the liquid application position is positioned at the center portion of the principal face of the substrate and the moving velocity of the liquid application position.

4. The substrate processing method according to claim 2, wherein the scan velocity determining step is a step of determining the moving velocity of the liquid application position according to a table indicating relationship between the supply time of the etching liquid under the state that the liquid application position is positioned at the center portion of the principal face of the substrate and a moving time of the liquid application position.

5. The substrate processing method according to claim 1, wherein the scan velocity determining step is a step of determining the moving velocity of the liquid application position for each of a plurality of intervals between the edge portion of the principal face of the substrate and the center portion of the principal face of the substrate.

* * * * *